(12) United States Patent
Leizerovich

(10) Patent No.: US 6,760,604 B2
(45) Date of Patent: Jul. 6, 2004

(54) PORTABLE RADIO TRANSCEIVER HAVING SHARED POWER SOURCE FOR AUDIO AND RF AMPLIFIERS

(75) Inventor: Gustavo D. Leizerovich, Aventura, FL (US)

(73) Assignee: Motorola, Inc., Schaumburg, IL (US)

(*) Notice: Subject to any disclaimer, the term of this patent is extended or adjusted under 35 U.S.C. 154(b) by 471 days.

(21) Appl. No.: 09/770,717

(22) Filed: Jan. 29, 2001

(65) Prior Publication Data

US 2002/0102952 A1 Aug. 1, 2002

(51) Int. Cl.⁷ ................................................. H04B 1/38
(52) U.S. Cl. ................ 455/574; 455/127.5; 455/343.1; 455/572; 330/279; 330/297
(58) Field of Search ............................... 330/127, 136, 330/129, 279, 297; 455/127.1, 127.2, 126, 127.5, 522, 574, 343.1, 572

(56) References Cited

U.S. PATENT DOCUMENTS

| | | | |
|---|---|---|---|
| 5,119,042 A | * 6/1992 | Crampton et al. | 330/295 |
| 5,216,379 A | * 6/1993 | Hamley | 330/134 |
| 5,251,330 A | 10/1993 | Chiba et al. | 455/91 |
| 5,311,143 A | * 5/1994 | Soliday | 330/127 |
| 5,420,536 A | 5/1995 | Faulkner et al. | 330/149 |
| 5,724,005 A | * 3/1998 | Chen et al. | 330/279 |
| 5,877,564 A | * 3/1999 | Kuiri | 307/38 |
| 5,999,829 A | * 12/1999 | Chun et al. | 455/572 |
| 6,122,491 A | * 9/2000 | Francisco | 455/127.2 |
| 6,148,220 A | * 11/2000 | Sharp et al. | 455/572 |
| 6,374,127 B1 | * 4/2002 | Park | 455/572 |
| 6,418,304 B1 | * 7/2002 | Morrar | 455/343.1 |

* cited by examiner

*Primary Examiner*—Edward F. Urban
*Assistant Examiner*—Blane J. Jackson
(74) *Attorney, Agent, or Firm*—Scott M. Garrett

(57) ABSTRACT

A radio transceiver (100) has both a radio frequency power amplifier (102) and a relatively high output audio power amplifier (110). The RFPA amplifies a linearly modulated signal. A shared power regulator (108) provides supply voltage to both amplifiers at the same time. However, usually only one is active at any given time, and hence the supply voltage is controlled so as to follow the envelope of the signal being amplified, whether it is the transmit signal or the audio signal. When both amplifiers are active, the supply voltage can be set to a fixed level, or it can follow the higher of the two envelopes.

11 Claims, 4 Drawing Sheets

PORTABLE RADIO TRANSCEIVER HAVING SHARED POWER SOURCE FOR AUDIO AND RF AMPLIFIERS

TECHNICAL FIELD

This invention relates in general to power control for mobile communication devices, and more particularly to optimizing the efficiency of power amplifiers in mobile communication devices.

BACKGROUND OF THE INVENTION

Portable radio transceivers, such as those found in ordinary communication devices, contain both a radio frequency (RF) amplifier and an audio amplifier. The RF amplifier amplifies the modulated radio signal that is transmitted by the device, while the audio amplifier amplifies the audio signal received by the device. In all portable or mobile communication devices battery life is an important design consideration. In most mobile communication devices the RF amplifier requires a relatively high amount of power. Accordingly, they are usually designed to be as efficient as permissible within other design criteria so as to reduce the power demand, and thus increase battery life. In many mobile communication devices, such as cellular phones, the audio amplifier does not use as much power because driving an earpiece speaker, even at full volume, doesn't require nearly as much power as the RF amplifier. However, in some mobile communication devices, such as trunked radios, the audio power is considerable because they drive a speaker that is meant to be heard at a distance. Furthermore, some cellular phones now provide speakerphone capability, which, liked trunked radio, is a form of half-duplex communication.

At the same time, several modulation formats have become popular, including some linear modulation types, such as, for example, quadrature amplitude modulation. Such modulation is used in several digital communication systems. However, one disadvantage of linear modulation is that the efficiency decreases as the difference between output and supply voltage increases. For linear RF amplifiers that are used with different power settings, the inefficiency may rival the power savings when transmitting at lower output power levels. However, the advantage of narrow channel spectral use is often found to be advantageous enough to accept such inefficiency, or to add circuitry to the device to counteract the inefficiency.

Just as linear RF amplifiers suffer from inefficiency when the voltage of the output drops significantly below the supply voltage, so to do audio amplifiers with variable power output. Since an audio signal has a variable amplitude, it is similar to linearly modulated RF signals. For the most part, the inefficiency of an audio amplifier is much smaller in most mobile communication devices, such as cellular telephones, because the earpiece speaker is driven with a small amount of power compared to the RFPA power. However, many trunked or two way radios use a much louder audio output, and some cellular or mobile telephones have a speakerphone mode of operation that likewise has a much higher power audio output compared to a conventional earpiece speaker output. The reason for the higher output is, obviously, so the user can hear from a distance the received audio signal.

In the design of portable and mobile battery powered devices the battery life is an important consideration. As such, designers strive to reduce the power demand and increase efficiency where possible. In a portable transceiver having both a radio frequency power amplifier and a high output audio power amplifier, the power consumption is generally higher than a conventional device having only a low power, earpiece audio output circuit. Therefore, in a transceiver device having a high output audio power amplifier, there is a need for a method and apparatus to increase the efficiency of transceiver operation to preserve battery life.

DETAILED DESCRIPTION OF A PREFERRED EMBODIMENT

Figure 1:
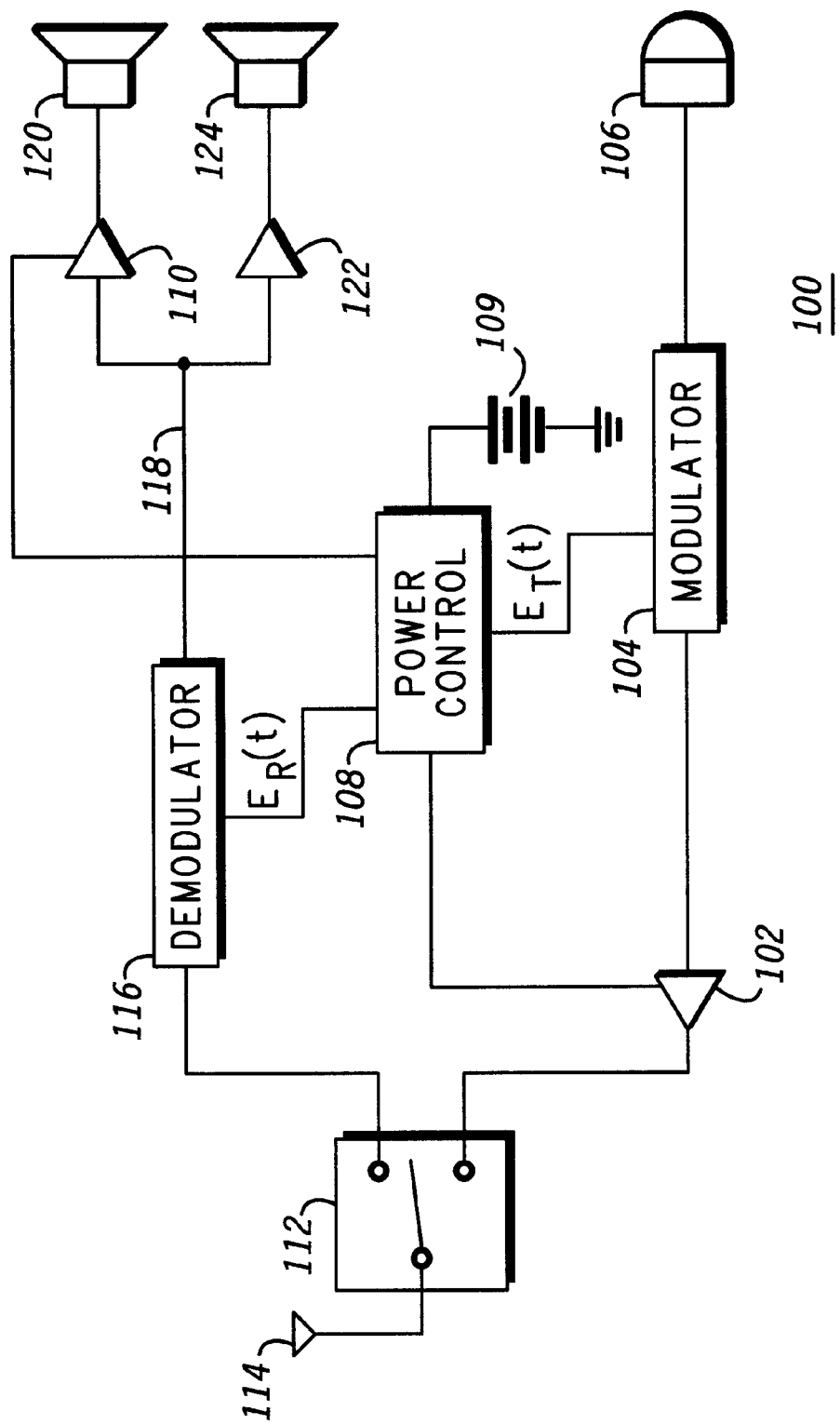
FIG. 1 shows a block circuit diagram of a portable radio transceiver having a shared power source, in accordance with the invention.

While the specification concludes with claims defining the features of the invention that are regarded as novel, it is believed that the invention will be better understood from a consideration of the following description in conjunction with the drawing figures, in which like reference numerals are carried forward. A brief description of the prior art is also thought to be useful.

The invention solves the problem of inefficiency in having multiple linear amplifiers in two steps. First, a power source is provided which tracks the signal to be amplified, and adjust the supply voltage to the amplifier in correspondence with that signal. By adjusting the supply voltage to the amplifier, the amplifier is kept near its saturation point, which is its most efficient operating point. Second, the power source is shared by both the audio amplifier and the radio frequency power amplifier (RFPA). Whichever amplifier is active, the output of the power source is adjusted in correspondence with the input signal to that amplifier. When both amplifiers are active, the power source can be set to a preselected level high enough to supply both amplifiers, or it can be adjusted in correspondence with the amplifier having the greater power demand.

Referring now to FIG. 1, there is shown a block circuit diagram of a portable radio transceiver 100 having a shared power source, in accordance with the invention. The transceiver comprises a radio frequency power amplifier (RFPA) 102 for amplifying a signal to be transmitted, such as a radio frequency signal provided by a modulator 104. The modulator modulates, for example, an audio signal produced at a microphone 106, which is to be transmitted. If the modulator provides linear modulation, the resulting signal will also have an envelope corresponding to the audio signal to be transmitted. Likewise, the RFPA, in the process of amplifying the linearly modulated signal, has a power demand that corresponds with the envelope of the signal to be transmitted. Peaks in the signal require more power, while valleys require less. In many such amplifiers the voltage of the signal is amplified, and since the load is relatively constant, the current follows the voltage, as does power. In the prior art, typically the voltage supplied to the RFPA is constant. That is, the magnitude of the voltage supplied to the RFPA in powering the RFPA does not change. However, this causes losses as the difference between the supply voltage and the output voltage increases. The power to the RFPA is provided by a shared power regulator or power source 108, which regulates voltage provided by a battery 109. By shared it is meant that the power and voltage provided by power source is shared by the RFPA and an audio amplifier 110. The RFPA is connected to an antenna switch 112 which alternatively couples an antenna 114 with the transmit path or the receive path, as is practiced in the art. The receive path comprises a demodulator 116 which demodulates a received radio signal, and provides an audio signal on line 118. The audio signal is fed to the audio amplifier 110 which is used for amplifying the audio signal to a level sufficient that it can be heard at a distance from a first speaker 120. A second audio amplifier 122 may be used to amplify the audio signal for near distance use, such as an earpiece 124. The received audio signal has an audio signal envelope, which corresponds to the audio amplifier power demand during operation.

The shared power regulator 108 provides power to both the RFPA and the audio amplifier 110 to meet the power demands of each of those components. To keep the respective amplifiers in an optimal operating state, the voltage provided by the shared power regulator is adjusted in correspondence with the signal envelope of the signals the respective amplifiers are amplifying. Most of the time this is possible because when the high output audio path is used, the transceiver is usually operating in a half-duplex mode of communication. That is, when the transceiver is transmitting, it is not receiving, and vice-versa. So, when the transceiver is transmitting, the output of the shared power source follows the envelope of the transmit signal, $E_T(t)$. When it is receiving, ti follows the audio signal envelope, $E_R(t)$. The control of the shared power source is such that it keeps the output voltage sufficiently high to avoid starving the presently active power amplifier. In general it controls the supply voltage supplied to the amplifiers to a level sufficient to meet both the RFPA power demand and the audio power amplifier demand when they are individually active. Occasionally, however, both amplifiers may be on, such as when the transceiver is sending control information to the communication infrastructure, as occurs during a hand-off in a cellular telephone. In cases when both the RFPA and audio amplifier need to be active, the power regulator can simply be set to it's highest output lever, or it can be controlled such that the output voltage follows envelope of the signal being amplified which requires the highest voltage level. In other words, the equivalent of a relative logical OR function is performed on the two envelope signals, and whichever one requires a higher output voltage level of the power regulator is the one the regulator follows. In other words, the shared power regulator controls the supply voltage level to a level at least as high as the higher of an RFPA voltage demand and an audio power amplifier voltage demand, where the RFPA voltage demand corresponds to the RFPA power demand, and the audio power amplifier voltage demand corresponds to the audio power amplifier power demand. Although, since the time period which both amplifiers may be active is anticipated to be very small, simply setting the shared power regulator output to a maximum level will likely not significantly impact battery life savings in transceivers operating under conventional wireless communication protocols. In a preferred embodiment, the voltage supplied to amplifiers is set such that the amplifier operates at 1 dB of backoff from the saturation point of the amplifier. By backoff it is meant that the supply voltage exceeds a level sufficient to operate the amplifier at its saturation point for the instantaneous output power magnitude. In other words, for a given output power level, a certain supply voltage level is required to keep the amplifier operating without an undesirable amount of distortion of the input signal due to saturation of the amplifier. In the preferred embodiment, the supply voltage exceeds whatever that minimum supply voltage would be by 1 dB, and so it can be said that the supply voltage maintains a 1 dB backoff.

Figure 2:
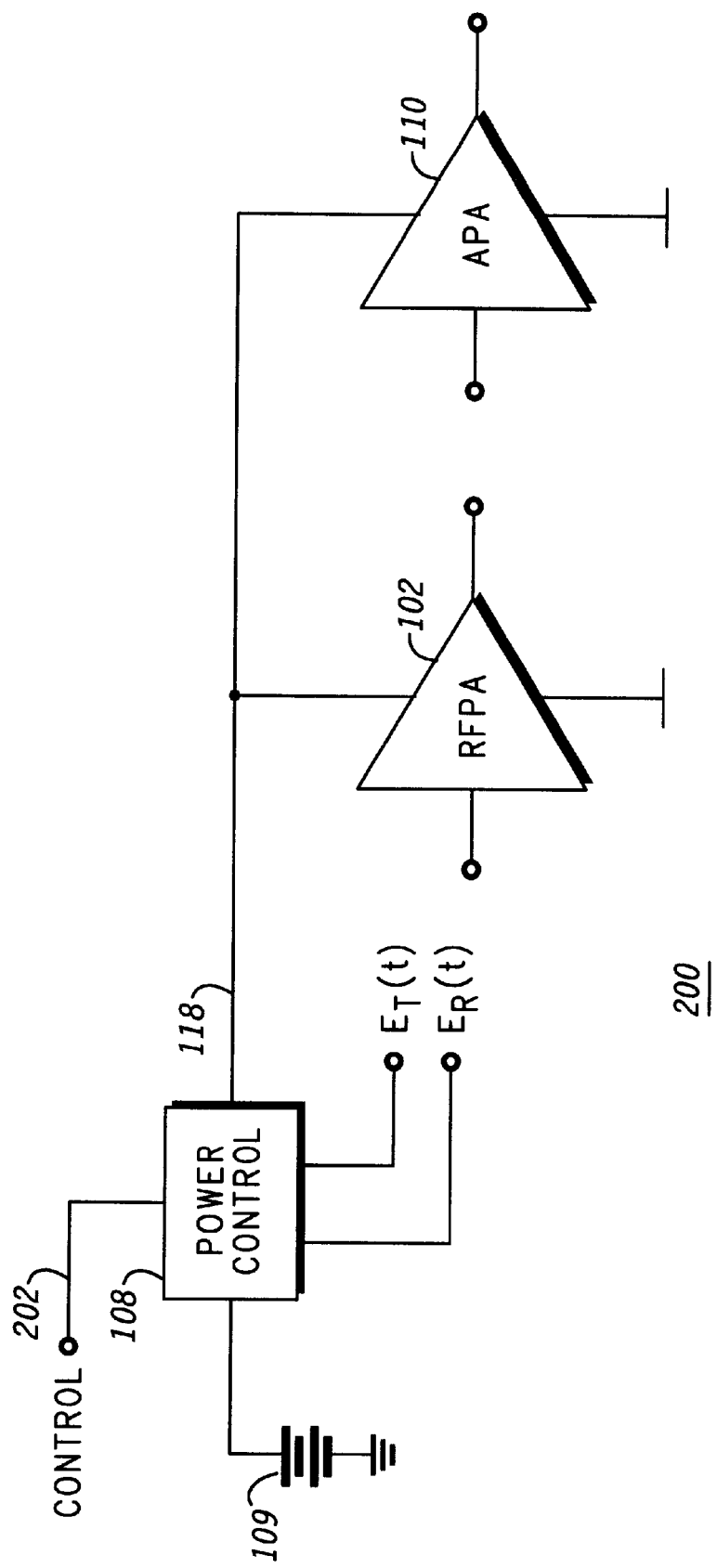
FIG. 2 shows a simplified block circuit diagram of a portable radio transceiver having a shared power source, in accordance with the invention.

Referring now to FIG. 2, there is shown a simplified block circuit diagram of a portable radio transceiver having a shared power source. A control line or control bus 202 is used to control operation of the shared power regulator 108. The transmit signal and audio signal envelopes $E_T(t)$ and $E_R(t)$, respectively are sampled by the power regulator. The output 118 is coupled to both the RFPA 102 and audio PA 110. It will be recognized by one skilled in the art that the two envelope signals $E_R(t)$ and $E_T(t)$ can be supplied to the power regulator individually, as shown, or a single line may be connected to the power regulator, and another portion of the transceiver may determine which signal is supplied, such as, for example, a digital signal processor which, in practice, performs the modulation and demodulation functions.

Figure 3:
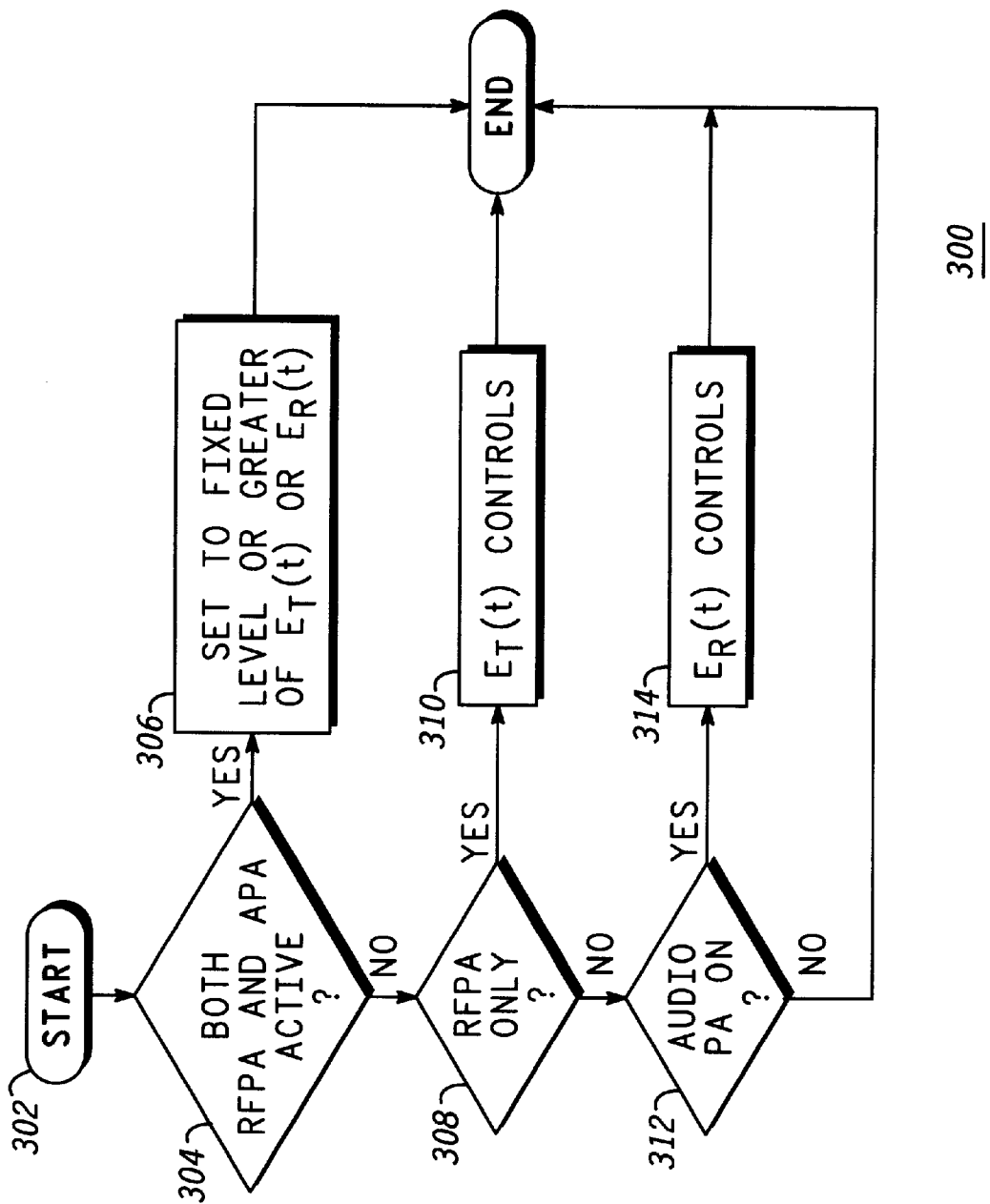
FIG. 3 shows a flow chart diagram of a method of operating a portable radio transceiver having a shared power source, in accordance with the invention.

The basic method of the invention is shown in FIG. 3, which is a flow chart diagram 300 of a method of operating a portable radio transceiver having a shared power source, in accordance with the invention. At the start 302, of course, the RFPA, audio PA, and shared power source, along with the other transceiver components, have been provided. In controlling the output of the power regulator, the transceiver can check to see if both the RFPA and audio PA need to be on (304). If so, then the output can be adjusted to meet the greater voltage demand of the two PAs or it can be set to a fixed level sufficient to meet the demand of either PA (306). When only one of the amplifiers is on, the method comprises controlling the supply voltage level in correspondence with the RFPA power demand when only the RFPA is on (308, 310), and controlling the supply voltage level in correspondence with the audio power amplifier power demand when only the audio power amplifier is on (312, 314). As mentioned previously, the supply voltage provided by the shared power regulator is preferably controlled so that the instantaneous level follows the envelope of the signal being amplified in such a way that the supply voltage level is no greater than necessary so as to reduce the power loss in the amplifier, and hence improve efficiency.

Figure 4:
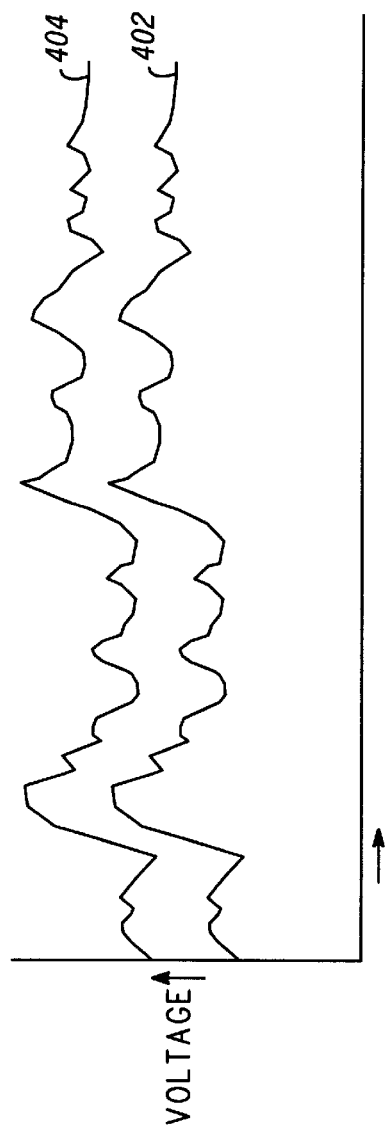
FIG. 4 shows a demonstrative graph chart of voltage versus time for the supply and output voltage of an amplifier operated in accordance with the invention.
Figure 5:
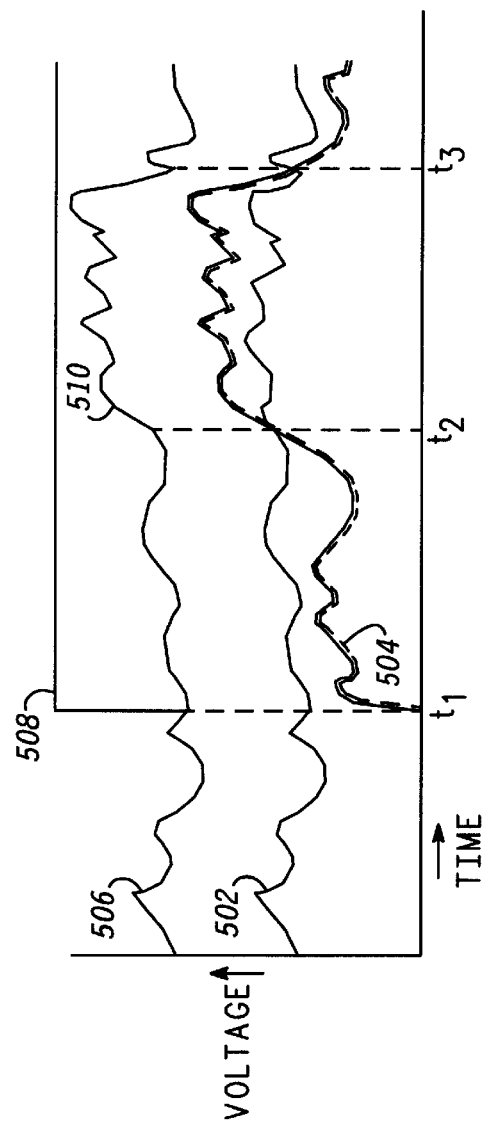
FIG. 5 shows a demonstrative graph chart of voltage versus time for the supply voltage and output voltage of both an audio amplifier and a RF power amplifier, in accordance with one embodiment of the invention.

FIG. 4 shows a demonstrative graph chart 400 of voltage versus time for the supply and output voltage of an amplifier operated in accordance with the invention. The lower curve 402 could be the envelope of the signal to be amplified or the voltage demand of the amplifier. All of these are in correspondence. The upper curve 404 represents the voltage supplied by the shared power regulator, and as can be seen, it follows the lower curve. FIG. 5 shows a demonstrative graph chart 500 of voltage versus time for the supply voltage and output voltage of both an audio amplifier and a RF power amplifier, in accordance with one embodiment of the invention. A first curve 502 represents the curve of, for example, the envelope of the transmit signal. A second curve 504 represent, for example, the envelope of a received audio signal, and begins after the transmit signal at a time $t_1$. A third curve 506 represent the supply voltage provided by the shared power regulator. Until $t_1$ only one amplifier is active, and therefore the supply voltage follows the envelope of the transmit signal. At $t_1$ however, the power regulator can be operated in one of several ways, such as simply setting the output supply voltage level to a fixed level 508, or it can follow the higher of the two signals. At time $t_2$ the audio envelope exceeds the transmit envelope, and continues to do so until time $t_3$. In response, between $t_2$ and $t_3$ the power regulator is controlled to follow the audio curve since it is higher.

The invention uses the technique of following the envelope of a signal to be amplified, and combines it with a shared power source. Since both the RFPA and audio PA amplify linear signals, controlling the supply voltage in correspondence with the envelope, and at as low a level as possible to avoid starvation, an optimum operating efficiency is obtained. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of controlling power in a transceiver of a mobile communication device, comprising:

providing a radio frequency power amplifier (RFPA) for amplifying a signal to be transmitted having a transmit signal envelope, the RFPA having an RFPA power demand corresponding to the transmit signal envelope;

providing an audio power amplifier for amplifying a received audio signal having an audio signal envelope, the audio power amplifier having an audio power amplifier power demand corresponding with the audio signal envelope;

providing a shared power regulator having a voltage output coupled to both the RFPA and the audio power amplifier, and for providing a supply voltage level at the voltage output;

controlling the supply voltage level in correspondence with the RFPA power demand when only the RFPA is on;

controlling the supply voltage level in correspondence with the audio power amplifier power demand when only the audio power amplifier is on; and controlling the supply voltage level to a level sufficient to meet both the RFPA power demand and audio power amplifier power demand when both the RFPA and audio power amplifier are on.

2. A method of controlling power as defined in claim 1, wherein the controlling the supply voltage level sufficient to meet both the RFPA power demand and audio power amplifier power demand comprises setting the supply voltage level to a fixed level when both the RFPA and audio power amplifier are on.

3. A method of controlling power as defined in claim 1, wherein the controlling the supply voltage comprises controlling the supply voltage to be at least 1 dB higher than necessary to operate at a saturation point of either the RFPA or the audio power amplifier.

4. A method of controlling power as defined in claim 1, wherein the controlling the supply voltage level in correspondence with the RFPA power demand when only the RFPA is on comprises maintaining the supply voltage at a 1 dB backoff level of the RFPA.

5. A method of controlling power as defined in claim 1, wherein the controlling the supply voltage level in correspondence with the audio power amplifier power demand when only the audio power amplifier is on comprises maintaining the supply voltage at a 1 dB backoff level of the audio power amplifier.

6. A radio transceiver, comprising:

a radio frequency power amplifier (RFPA) for amplifying a signal to be transmitted having a transmit signal envelope, the RFPA having an RFPA power demand corresponding to the transmit signal envelope;

an audio power amplifier for amplifying a received audio signal having an audio signal envelope, the audio power amplifier having an audio power amplifier power demand corresponding with the audio signal envelope; and a shared power regulator having a voltage output coupled to both the RFPA and the audio power amplifier, and for providing a supply voltage level at the voltage output;

wherein the shared power regulator controls the voltage output in correspondence with the RFPA power demand when only the RFPA is on, and in correspondence with the audio power amplifier power demand when only the audio power amplifier is on; and wherein the shared power regulator controls the supply voltage level to a level sufficient to meet both the RFPA power demand and audio power amplifier power demand when both the RFPA and audio power amplifier are on.

7. A radio transceiver as defined in claim 6, wherein the shared power regulator controls the supply voltage level to a fixed level when both the RFPA and audio power amplifier are on.

8. A radio transceiver as defined in claim 6, wherein the shared power regulator controls the supply voltage level to a level at least as high as the higher of an RFPA voltage demand and an audio power amplifier voltage demand, the RFPA voltage demand corresponding to the RFPA power demand, the audio power amplifier voltage demand corresponding to the audio power amplifier power demand.

9. A radio transceiver as defined in claim 8, wherein the shared power regulator controls the supply voltage level to a level at least as high as the higher of a 1 dB backoff level for the RFPA and a 1 dB backoff level for the audio amplifier.

10. A radio transceiver as defined in claim 6, wherein the shared power regulator controls the supply voltage level to maintain the supply voltage at a 1 dB backoff level of the RFPA when only the RFPA is on.

11. A radio transceiver as defined in claim 6, wherein the common power supply controls the supply voltage level to maintain the supply voltage at a 1 dB backoff level of the audio amplifier when only the audio amplifier is on.

* * * * *